(12) United States Patent
Kim

(10) Patent No.: US 8,422,304 B2
(45) Date of Patent: Apr. 16, 2013

(54) FLASH MEMORY DEVICE AND METHOD FOR MANUFACTURING FLASH MEMORY DEVICE

(75) Inventor: Dae Il Kim, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 146 days.

(21) Appl. No.: 12/970,384

(22) Filed: Dec. 16, 2010

(65) Prior Publication Data

US 2011/0141806 A1    Jun. 16, 2011

(30) Foreign Application Priority Data

Dec. 16, 2009 (KR) .................. 10-2009-0125747
Apr. 12, 2010 (KR) .................. 10-2010-0033237

(51) Int. Cl.
*G11C 11/34* (2006.01)

(52) U.S. Cl.
USPC ................................. 365/185.2; 365/185.24

(58) Field of Classification Search ............... 365/185.2, 365/185.24
See application file for complete search history.

(56) References Cited

U.S. PATENT DOCUMENTS 7,265,411 B2 * 9/2007 Kang ........................... 257/317

FOREIGN PATENT DOCUMENTS

| KR | 10-2003-0057896 A | 7/2003 |
| KR | 10-2005-0069573 A | 7/2005 |

OTHER PUBLICATIONS

Office Action dated Aug. 29, 2011, in Korean Application No. 10-2010-0033237 filed Apr. 12, 2010.

* cited by examiner

*Primary Examiner* — Michael Tran
(74) *Attorney, Agent, or Firm* — Saliwanchik, Lloyd & Eisenschenk

(57) ABSTRACT

A method of manufacturing a flash memory device is provided. First and second gates are formed on first and second dielectrics and spaced apart from each other on a cell area of a substrate. A third gate is formed on a third dielectric that is formed on first opposing sidewalls of the first gate and extending on a portion of the substrate from the first opposing sidewalls. A fourth gate is formed on a fourth dielectric that is formed on second opposing sidewalls of the second gate and extending on a portion of the substrate from the second opposing sidewalls. The third gate and third dielectric on one of the first opposing sidewalls facing the second gate and the fourth gate and fourth dielectric on one of the second opposing sidewalls facing the first gate are removed. Drain areas are formed at outer sides of the third and fourth gates, and a common source area is formed between the first and second gates.

18 Claims, 7 Drawing Sheets

FLASH MEMORY DEVICE AND METHOD FOR MANUFACTURING FLASH MEMORY DEVICE

CROSS-REFERENCE TO RELATED APPLICATIONS

This application claims the benefit under 35 U.S.C. §119 of Korean Patent Application Nos. 10-2009-0125747, filed on Dec. 16, 2009, and 10-2010-0033237, filed on Apr. 12, 2010, which are hereby incorporated by reference in their entirety.

BACKGROUND

The present disclosure relates to a flash memory device and a method of manufacturing the flash memory device.

A flash memory device is a non-volatile storage medium and thus no power is needed to maintain data stored therein. In addition, the flash memory device has an advantage of offering relatively fast process speeds such as fast programming speed, fast read access speed, and fast erasing speed.

For the flash memory device, a semiconductor device using a silicon-oxide-nitride-oxide-silicon (SONOS) structure is often used. Many masks for forming patterns are used to manufacture the SONOS memory device.

Charges injected into a dielectric (e.g., a nitride layer) of the SONOS memory device are trapped by being dangling-bonded on the silicon substrate. Electrons are injected during a programming process and holes are injected during an erasing process. When the electrons and holes are injected into the dielectric, an energy barrier of the holes is higher than that of the electrons. Accordingly, the SONOS memory device has lower erasing process efficiency. This is one important characteristic of memory cells.

The erasing process method is roughly categorized into a Fowler-Nordeim (FN) tunneling method and a band-to-band-tunneling (BTBT) hot hole injection method. The method of the erasing process is determined depending on a method of a programming process.

For the programming process using the FN tunneling method, since the electrons are distributed throughout a channel, the erasing process must be also performed by the FN tunneling method to erase the electrons. In this case, in order to effectively erase a cell, a tunnel oxide of the structure must be thinly formed, such as having a thickness of about 20~30 Å. This deteriorates a retention property of the electrons. However, when a thickness of the tunnel oxide increases, an erasing time increases or a voltage necessary to perform the erasing process increases, and a back-tunneling phenomenon where the electrons are introduced from a gate to the insulation layer (tunnel oxide) occurs.

For the programming process using a channel hot electron (CHE) method, since the electrons are distributed in the gate and an ion implantation area of a side surface of the gate, the erasing process is performed by the BTBT hot hole injection method. In this case, since the distribution of the electrons and charges in the ion injection area becomes an important factor determining a cell characteristic, a junction structure of the ion injection area and operating voltage application condition could be important.

Meanwhile, since the charges are distributed within 100 nm of the ion injection area, the insulation area outside of the charge distribution area is unnecessary. That is, the insulation area outside of the charge distribution area causes the increase of erasing voltage and the decrease of cell current. Therefore, a technique for reducing a length of the dielectric by removing an unnecessary side end of the insulation area and a technique for self-aligning a middle portion of the dielectric by dividing a select/memory gate into two sections have been proposed.

However, the former case has a limitation in that, since it is difficult to define a critical dimension and removal area in a photolithography process, chips have different properties. The latter case has a limitation in that the process is complicated and the cell property may be deteriorated.

Further, when the memory gate is formed after the select gate, an L-shaped dielectric is formed near the select gate, and the electrons are injected through a source side injection (SSI) process, the electrons trapped at a corner portion of the dielectric are not erased. Thus, an endurance property is deteriorated.

BRIEF SUMMARY

Embodiments provide a flash memory device that can be composed of a variety of cell arrays without an odd-even characteristic, effectively realize operating voltage application, and minimize influence of stress and disturbance that occur during a cell arraying operation.

Embodiments also provide a method of manufacturing a flash memory device, which can simplify the manufacturing processes by reducing the number of process masks when a flash memory having a SONOS structure is formed.

In one embodiment, a method of manufacturing a flash memory device includes forming a first gate on a first dielectric on a cell area of a substrate and a second gate on a second dielectric on the cell area of the substrate spaced apart from the first gate and first dielectric; forming a third dielectric on opposing sidewalls of the first gate and a portion of the substrate around the opposing sidewalls of the first gate and third gates on the third dielectric on the opposing sidewalls of the first gate, forming a fourth dielectric on opposing sidewalls of the second gate and a portion of the substrate around the opposing sidewalls of the second gate and fourth gates on the fourth dielectric on the opposing sidewalls of the second gate, and forming a fifth dielectric and a fifth gate on a portion of a peripheral area of the substrate; removing the third dielectric and third gate from the opposing sidewall of the first gate facing the second gate and removing the fourth dielectric and fourth gate from the opposing sidewall of the second gate facing the first gate such that the third dielectric and third gate on the opposing sidewall of the first gate facing away from the second gate remains and the fourth dielectric and fourth gate on the opposing sidewall of the second gate facing away from the first gate remains; forming a first spacer near the remaining third gate, a second spacer near the opposing sidewall of the first gate facing the second gate, a third spacer near the opposing sidewall of the second gate facing the first gate, a fourth spacer near the remaining fourth gate, and fifth spacers on opposing sidewalls of the fifth gate; and forming first and second drain areas on a portion of the cell area near the first and fourth spacers, respectively, forming a common source area on a portion of the cell area between the second and third spacers, and forming a source area and a third drain area at sides of the fifth spacers on a portion of the peripheral area at opposing sides of the fifth gate.

In another embodiment, a flash memory device includes a first gate on a first dielectric and a second gate on a second dielectric on a cell area of a substrate, wherein the first gate and first dielectric is spaced apart from the second gate and second dielectric; a fifth gate on a fifth dielectric on a peripheral area of the substrate; a third dielectric on a sidewall of the first gate facing away from the second gate and a portion of the substrate near the sidewall of the first gate; a fourth dielectric on a sidewall of the second gate facing away from the first gate and a portion of the substrate near the sidewall of the second gate; a third gate on the third dielectric and a fourth gate on the fourth dielectric; a first spacer on a side portion of the third gate, a second spacer on a sidewall of the first gate facing the second gate, a third spacer on a sidewall of the second gate facing the first gate, and a fourth spacer on a side portion of the fourth gate; fifth spacers on opposing sidewalls of the fifth gate; a common source area on the substrate between the second and third spacers; first and second drain areas on the substrate near sides of the first and fourth spacers, respectively; and a source area and a third drain area on the substrate near the fifth spacers on opposing sides of the fifth gate.

In yet another embodiment, a method of manufacturing a flash memory device includes forming a first gate on a first dielectric on a cell area of a substrate; forming a third dielectric on a side of the first gate and a portion of the substrate near the side of the first gate; forming a third gate on the third dielectric; forming a common source area on the cell area near an opposite side of the first gate from the third gate; and forming a drain area on a portion of the cell area near the third gate.

In still another embodiment, a flash memory device includes a first gate on a cell area of a substrate; a first dielectric under the first gate; a common source area on the substrate near a side surface of the first gate; a third dielectric on an opposite side surface of the first gate and a portion of the substrate near the opposite side surface of the first gate; a third gate on the third dielectric; and a first drain area on the substrate near a side of the third gate.

The details of one or more embodiments are set forth in the accompanying drawings and the description below. Other features will be apparent from the description and drawings, and from the claims.

BRIEF DESCRIPTION OF THE DRAWINGS

FIG. 1 is a schematic side sectional view after first and second wells are formed in accordance with an embodiment of a flash memory device.

FIG. 2 is a schematic side sectional view after a first polysilicon layer is formed in accordance with an embodiment of a flash memory device.

FIG. 3 is a schematic side sectional view after first and second gates are formed in accordance with an embodiment of a flash memory device.

FIG. 4 is a schematic side sectional view after a second polysilicon layer is formed in accordance with an embodiment of a flash memory device.

FIG. 5 is a schematic side sectional view after third and fourth gates are formed in accordance with an embodiment of a flash memory device.

FIG. 6 is a schematic side sectional view after third and fourth dielectrics and third and fourth gates between first and second gates are removed in accordance with an embodiment of a flash memory device.

FIG. 7 is a schematic side sectional view after a common source area is formed in accordance with an embodiment of a flash memory device.

FIG. 8 is a schematic side sectional view after a lightly doped drain (LDD) area is formed in accordance with an embodiment of a flash memory device.

FIG. 9 is a schematic side sectional view after first, second, third, fourth, and fifth spacers are formed in accordance with an embodiment of a flash memory device.

FIG. 10 is a schematic side sectional view after a silicide layer is formed in accordance with an embodiment of a flash memory device.

FIG. 11 is a schematic side sectional view after an interlayer dielectric is formed in accordance with an embodiment of a flash memory device.

DETAILED DESCRIPTION

Reference will now be made in detail to certain embodiments of the present disclosure, examples of which are illustrated in the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

FIGS. 1-11 illustrate a method for manufacturing a flash memory device according to an embodiment.

Figure 1:
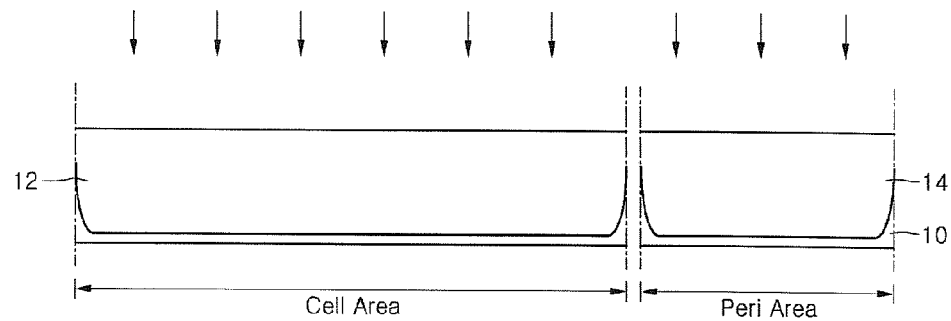
FIGS. 1-11 illustrate a method of manufacturing a flash memory device according to an embodiment of the invention.

As shown in FIG. 1, a semiconductor substrate 10 includes a cell area and a peripheral area. An active area is defined by forming an isolation layer (not shown) on the semiconductor substrate 10.

A first well 12 is formed in the cell area by performing a first ion implantation process in the semiconductor substrate 10, and a second well 14 is formed by performing a second ion implantation process in the semiconductor substrate 10. The second well 14 may be formed after forming the first well 12.

At this point, the first and second ion injection processes may be performed using a variety of masks. That is, since a dose rate and type of the ions vary depending on a voltage value used in gates, the ions may be implanted using the masks and processes based on the respective gates.

The first well 12 can be a well of an area at which a gate using high voltage will be formed.

Figure 2:
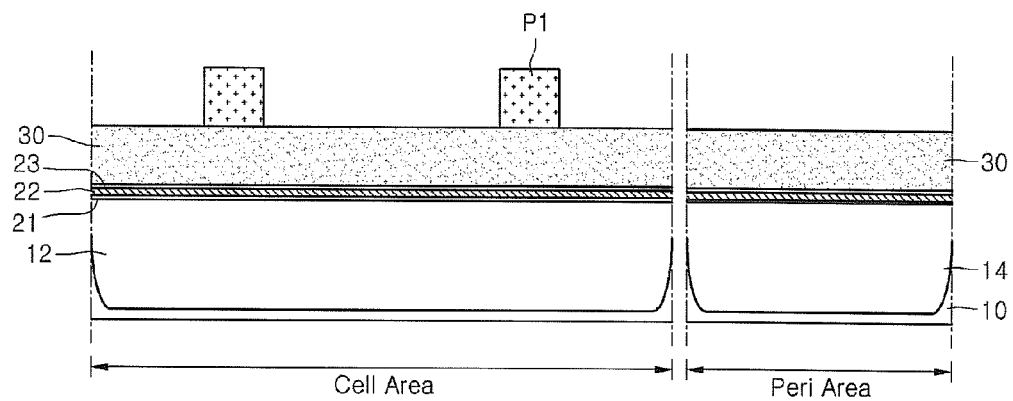

FIG. 2 is a schematic side sectional view of the flash memory device after a first polysilicon layer is formed.

As shown in FIG. 2, an oxide-nitride-oxide (ONO) layer, which can be formed with a first oxide layer 21, a first nitride layer 22, and a second oxide layer 23, and a first polysilicon layer 30 are formed on the semiconductor substrate 10 having the first and second wells 12 and 14.

After the above, a first photoresist pattern P1 defining first and second gate areas is formed on the first polysilicon layer 30.

At this point, the first oxide layer 21, first nitride layer 22, second oxide layer 23, and first polysilicon layer 30 may be formed on the substrate 10 in both the cell and peripheral areas.

For reference, the first and second oxide layers 21 and 23 may be formed of a material having a high dielectric constant (high-k) such as $SiO_2$ having a dielectric constant of 4 or $HfO_2$, $ZrO_2$, and $HfSi_xO_y$ (where x and y are natural numbers) each having a dielectric constant (k) greater than 4.

In addition, according to certain embodiments, instead of the first nitride layer 22 functioning as a trapping layer, a metal nano-crystal layer, a germanium (Ge) nano-crystal layer, or a silicon (Si) nano-crystal layer may be formed in its place.

Figure 3:
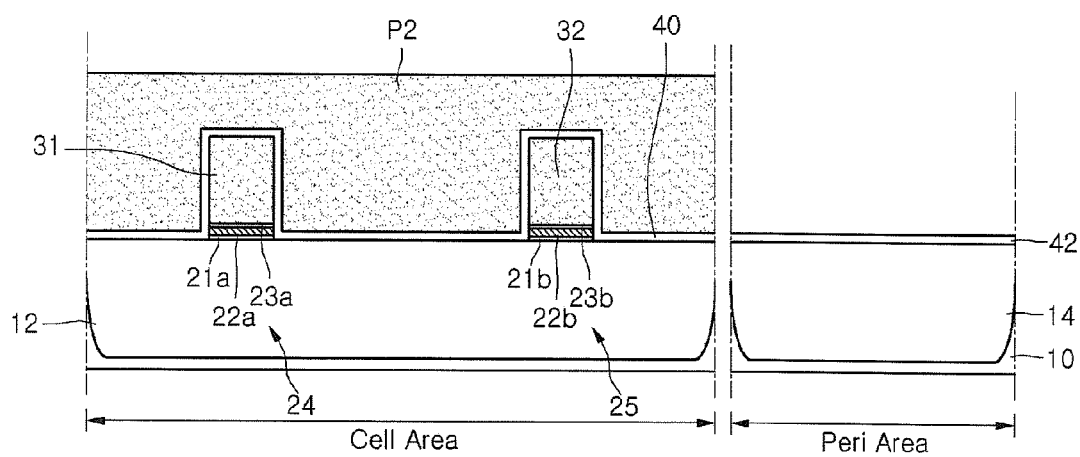

FIG. 3 is a schematic side sectional view of the flash memory device after first and second gates are formed.

As shown in FIG. 3, a first etching process is performed by using the first photoresist pattern P1 as a mask. As a result, a first dielectric 24, a first gate 31, a second dielectric 25, and a second gate 32 are formed on the semiconductor substrate 10.

At this point, the first oxide layer 21, first nitride layer 22, second oxide layer 23, and first polysilicon layer 30 that are formed at the peripheral area may be removed through the first etching process.

Next, the first photoresist pattern P1 is removed.

The first dielectric 24 can be formed in the ONO structure having a first oxide layer pattern 21a, a first nitride layer pattern 22a, and a second oxide layer pattern 23a. Similarly, the second dielectric 25 can be formed in the ONO structure having a first oxide pattern 21b, a first nitride pattern 22b, and a second oxide pattern 23b.

The first and second gates 31 and 32 are formed by the pattern of the first polysilicon layer 30 and function as memory gates of the flash memory device of this embodiment.

In accordance with an embodiment, the first dielectric 24, first gate 31, second dielectric 25, and second gate 32 provide a silicon-oxide-nitride-oxide-silicon (SONOS) structure.

In a further embodiment, a high temperature heat-treatment process is performed for the first and second gates 31 and 32 to mitigate certain phenomena during a subsequent ion implantation process.

Next, as shown in FIG. 3, a third oxide layer 40 is formed on the semiconductor substrate 10 having the first dielectric 24, first gate 31, second dielectric 25, and second gate 32, and a second photoresist pattern P2 is formed on the semiconductor substrate 10 at the cell area.

The third oxide layer 40 formed in the peripheral area is removed by performing a second etching process in which the second photoresist pattern P2 is used as a mask. Then, a fourth oxide layer 42 is formed on the semiconductor substrate 10 at the peripheral area.

The fourth oxide layer 42 may have a thickness less than that of the third oxide layer 40.

After the above, the second photoresist pattern P2 is removed.

Figure 5:
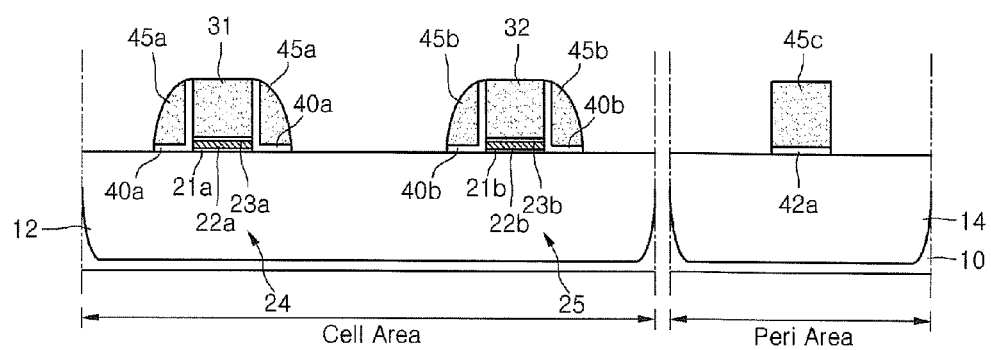

In processes following the above-described process, the third oxide layer 40 becomes a gate dielectric for a high voltage transistor and the fourth oxide layer becomes a gate dielectric for a low voltage transistor (see FIG. 5).

For example, the third oxide layer 40 can be thickly formed through a high temperature oxide (HTO) process and functions to protect the memory gates (the first and second gates 31 and 32) when select gates (third and fourth gates) are formed in a following process.

In operation, the select gates and the memory gates are simultaneously applied with high voltage.

Figure 4:
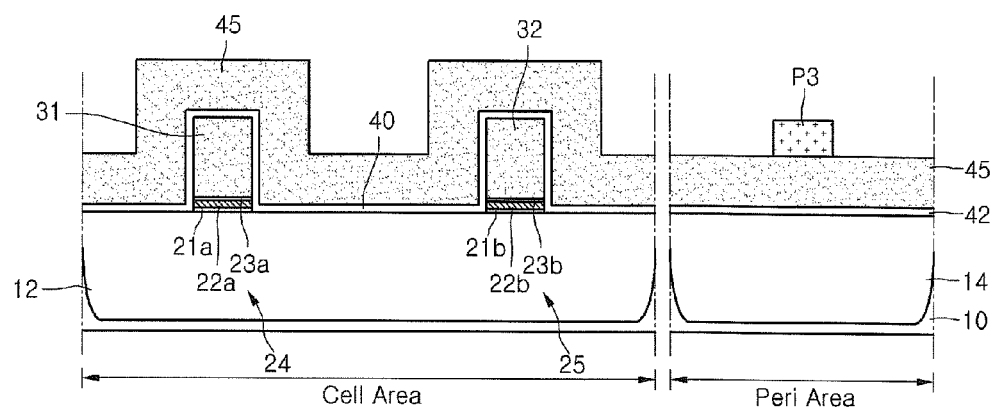

FIG. 4 is a schematic side sectional view of the flash memory device after a second polysilicon layer is formed.

As shown in FIG. 4, a second polysilicon layer 45 is formed on the third and fourth oxide layers 40 and 42, and a third photoresist pattern P3 defining a fifth gate area of the peripheral area is formed.

FIG. 5 is a schematic side sectional view of the flash memory device after third and fourth gates are formed.

As shown in FIG. 5, a third dielectric 40a defined by a pattern of the third oxide layer 40 is formed in an L-shape on opposite sidewalls of each of the first gate 31 and first dielectric 24 and a portion of the semiconductor 10 around the first gate 31 by performing a third etching process.

Further, a fourth dielectric 40b defined by a pattern of the third oxide layer 40 is formed in an L-shape on opposite sidewalls of each of the second gate 32 and second dielectric 25 and a portion of the semiconductor 10 around the second gate 32 by performing the third etching process.

At this point, third and fourth gates 45a and 45b are respectively formed on the third and fourth dielectrics 40a and 40b during the etching of the second polysilicon layer 45 in the third etching process.

In addition, a fifth gate 45c defined by a pattern of the second polysilicon layer 45 is formed on the fifth dielectric 42a and a fifth dielectric 42a defined by a pattern of the fourth oxide layer 42 below the fifth gate 45c is formed on the semiconductor substrate 10 in the peripheral area through the third etching process.

After the above, the third photoresist pattern P3 is removed.

That is, the third etching process for the cell area is a blanket etch, and the third etching process for the peripheral area is performed by using the third photoresist pattern P3 as an etching mask.

Figure 6:
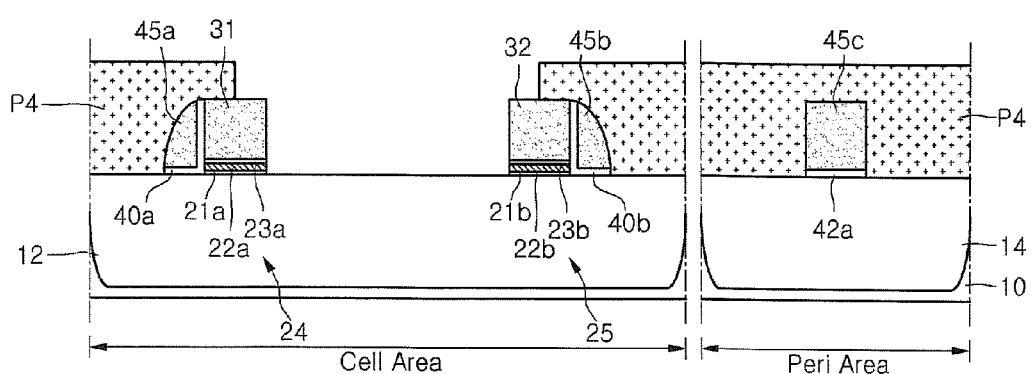

FIG. 6 is a schematic side sectional view of a flash memory device after the third and fourth dielectrics and third and fourth gates between the first and second gates are removed.

As shown in FIG. 6, a fourth photoresist pattern P4 for opening an area between the first and second gates 31 and 32 is formed, after which a fourth etching process is performed.

Accordingly, the third and fourth dielectrics 40a and 40b and third and fourth gates 45a and 45b between the first and second gates 31 and 32 can be removed.

At this point, the remaining third and fourth gates 45a and 45b may function as select gates.

Figure 7:
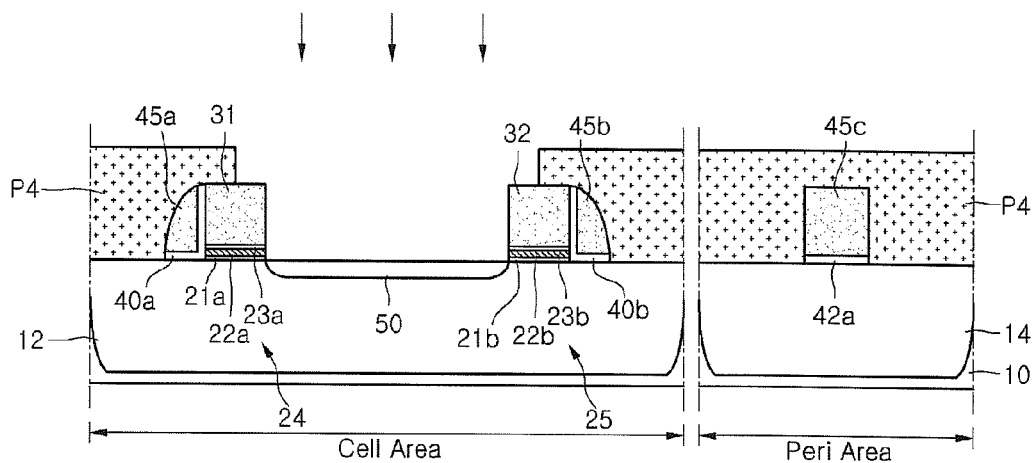

FIG. 7 is a schematic side sectional view of the flash memory device after a common source area is formed.

As shown in FIG. 7, a third ion implantation process is performed by using the fourth photoresist pattern P4, first gate 31, and second gate 32 as an implantation mask.

Accordingly, a source-side LDD area 50 is formed on a portion of the semiconductor substrate 10 between the first and second gate 31 and 32.

After the above, the fourth photoresist pattern P4 is removed.

Figure 8:
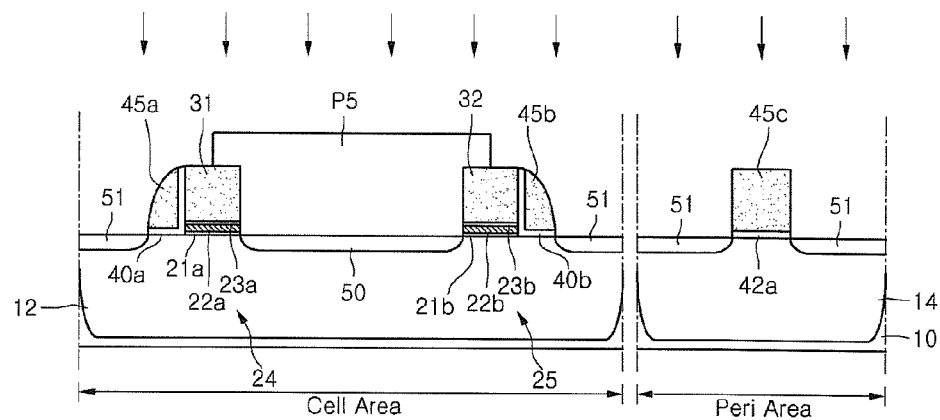

FIG. 8 is a schematic side sectional view of a flash memory device according to an embodiment after lightly doped drain (LDD) areas are formed.

Referring to FIG. 8, according to an embodiment, after the source-side LDD area 50 is formed, a fifth photoresist pattern P5 covering the source-side LDD area 50 and at least a portion of each of the first gate 31 and the second gate 32 is formed. Then, a fourth ion implantation process is performed using the fifth photoresist pattern P5 as an implant mask.

Accordingly, drain-side LDD areas 51 are respectively formed on a portion of the semiconductor substrate 10 in the cell area around the third gate 45a, a portion of the semiconductor substrate 10 in the cell area around the fourth gate 45b, and a portion of the semiconductor substrate 10 in the peripheral area at sides of the fifth gate 45c.

Next, the fifth photoresist pattern P5 is removed.

Figure 9:
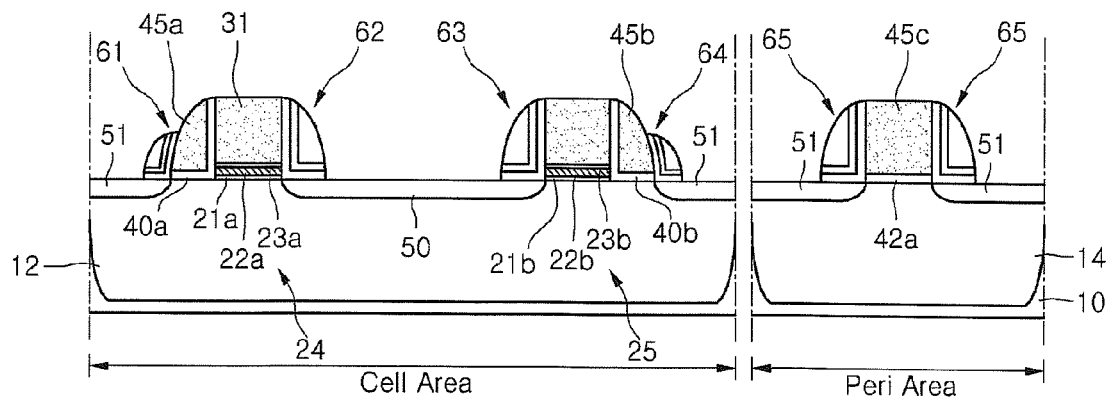

FIG. 9 is a schematic side sectional view of the flash memory device after first, second, third, fourth, and fifth spacers are formed.

Referring to FIG. 9, an oxide layer, a nitride layer, and an oxide layer are sequentially stacked on the semiconductor substrate 10 in both the cell and peripheral areas, after which a fifth etching process is performed by a blanket method.

Accordingly, a first spacer 61 is formed near the third gate 45a and a second spacer 62 is formed near the first gate 31. In addition, a third spacer 63 is formed near the second gate 32 and a fourth spacer 64 is formed near the fourth gate 45b.

Further, fifth spacers 65 are formed on respective opposite sidewalls of the fifth gate 45c.

The remaining stacked structure formed by the oxide layer, nitride layer, and oxide layer is removed during the fifth etching process.

Although the spacers 61, 62, 63, 64, and 65 are formed in an ONO structure in the embodiment described with respect to FIG. 9, the present invention is not limited to this structure. For example, the spacers 61, 62, 63, 64, and 65 may be formed in an oxide-nitride (ON) structure.

Figure 10:
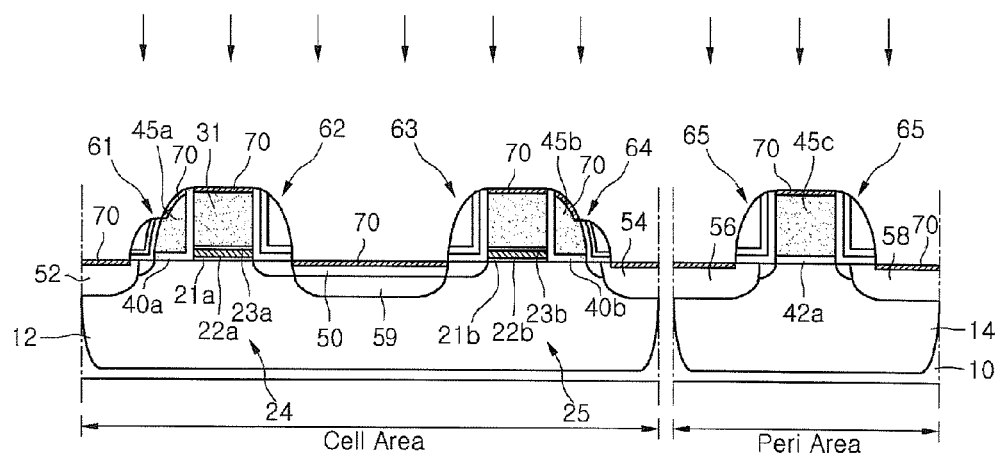

FIG. 10 is a schematic side sectional view of the flash memory device after a silicide layer is formed.

After the first to fifth spacers 61 to 65 are formed, a fifth ion implantation process is performed to form a first drain area 52 on a portion of the semiconductor substrate 10 in the cell area around the first spacer 61 and a second drain area 54 on a portion of the semiconductor substrate 10 in the cell area around the fourth spacer 64.

In addition, a common source area 59 is formed on a portion of the semiconductor substrate 10 in the cell area between the second spacer 62 and the third spacer 63.

Further, a source area 56 is formed on a portion of the semiconductor substrate 10 in the peripheral area at a side of one of the fifth spacers 65 and a third drain area 58 is formed on a portion of the semiconductor substrate 10 in the peripheral area at a side of the other of the fifth spacers 65.

The fifth ion implantation process may be performed through multiple steps using one or more masks because the implantation of the ions such as n-type ions, p-type ions, and the like is differently performed depending on a kind (or function) of the gates. That is, different masks may be used for the different device gates.

In addition, according to an embodiment shown in FIG. 10, a silicide is formed on a portion of the third gate 45a exposed by the first spacer 61, a portion of the fourth gate 45b exposed by the fourth spacer 64, the first gate 31, the second gate 32, the first drain area 52, the common source area 59, the second drain area 54, the fifth gate 45c, the source area 56, and the third drain area 58.

The silicide layer 70 may be formed through a silicide process using titanium (Ti), cobalt (Co), Nickel (Ni), and the like. The silicon layer 70 may be further formed on an area where a contact will be formed.

Figure 11:
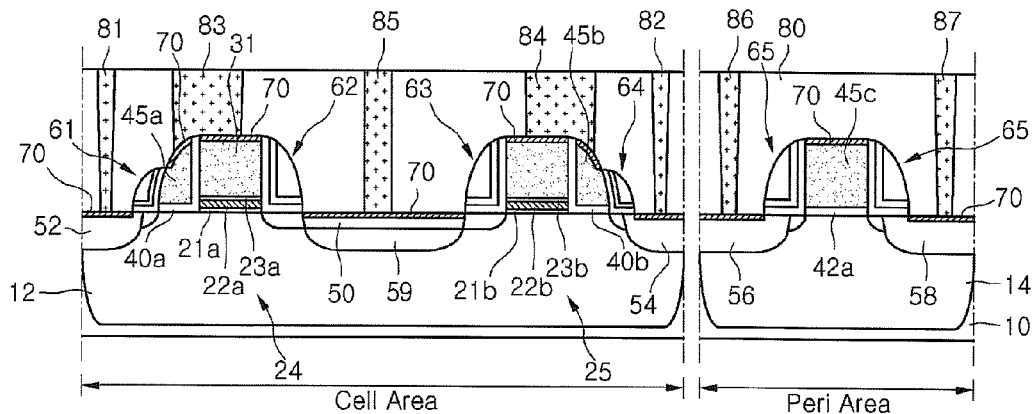

FIG. 11 is a schematic side sectional view of the flash memory device after an interlayer dielectric is formed.

Referring to FIG. 11, an interlayer dielectric 80 is formed on the semiconductor substrate 10 including the above-described semiconductor structure, and a first contact 81, a second contact 82, a third contact 83, a fourth contact 84, a fifth contact 85, a sixth contact 86, and a seventh contact 87 are formed through the interlayer dielectric.

The first contact 81 is connected to the first drain area 52 through the silicide layer 70 on the first drain area 52, and the second contact 82 is connected to the second drain area 54 through the silicide layer 70 on the second drain area 54.

In addition, the third contact 83 is a common contact that is connected to both the third gate 45a and the first gate 31 through the silicide layer 70 on the portion of the third gate 45a exposed by the first spacer 61 and the silicide layer 70 on the first gate 31.

The fourth contact 84 is a common contact that is connected to both the fourth gate 45b and the second gate 32 through the silicide layer 70 on the portion of the fourth gate 45b exposed by the fourth spacer 64 and the silicide layer 70 on the second gate 32.

The fifth contact 85 is connected to the common source area 59 through the silicide layer 70 on the common source area 59, and the sixth and seventh contacts 86 and 87 are respectively connected to the source area 56 and the third drain area 58 through the silicide layer 70 on the source area 56 and third drain area 58, respectively.

The flash memory device according to an embodiment provides a cell unit by dividing semiconductor substrate into the cell and peripheral areas and forming two semiconductor structures that are symmetrical with reference to the common source area 59 on the semiconductor substrate.

However, it is also possible to compose a cell unit using one semiconductor structure in the cell area. That is, the cell unit may be provided by the first gate 31, the first dielectric 24, the third dielectric 40a, the first spacer 61, the second spacer 62, the drain area 51, and the common source area 59.

This will be briefly described hereinafter.

In accordance with an embodiment using one semiconductor structure in a cell unit, the first well 12 is formed in the substrate 10 in the cell area and the first dielectric 24 is formed on the first well 12. In addition, the first gate 31 is formed on the first dielectric 24.

The first dielectric 24 and the first gate 31 may be formed through the method that is described with reference to FIGS. 1 through 11. That is, a first oxide layer 21, first nitride layer 22, second oxide layer 23, and first polysilicon layer 30 can be sequentially formed on the cell area and the first photoresist pattern P1 defining the first gate area is formed on the cell area.

Next, a first gate 31 is formed by a first polysilicon pattern corresponding to the first photoresist pattern P1, after which a first dielectric 24 having a first oxide layer pattern 21a, first nitride layer pattern 22a, and second oxide layer pattern 23a is formed through the first etching process (see FIGS. 2 and 3).

After the above, the first photoresist pattern P1 is removed.

Then, a third dielectric 40a is formed on a sidewall of the first gate 31 and a portion of the substrate 10, and a third gate 45a is formed on the third dielectric 40a.

At this point, similar to the embodiment described with reference to FIGS. 1 to 11, the third dielectric 40a is formed on the opposing sidewalls of the first gate 31 and the portion of the substrate 10 around the sidewalls, and the third gate 45a is formed on the third dielectric 40a at both opposing sidewalls (see FIG. 5).

That is, the third gate 45a is formed through an etching process of a second polysilicon layer using the blanket method and the third dielectric 40a is formed from a third oxide layer through the etching process using the blanket method.

However, by removing the third gate 45a and the third dielectric 40a at one sidewall of the first gate 31, the third dielectric 40a may be formed on one sidewall of the first gate 31 and the portion of the substrate 10 around the one sidewall of the first gate 31 (see FIG. 6).

After certain implantation processes, an ONO layer is formed on the cell area and this resulting structure is etched by a fifth etching process using the blanket method to form a first spacer 62 near the third gate 45a and a second spacer 62 near the first gate 31.

After the above, a common source area 59 is formed in the cell area near the first gate 31 at a side of the second spacer 62, and a first drain area 52 is formed in a portion of the cell area near the third gate 45a.

In the above-described unit cell having a single semiconductor structure, the third and first gates 45a and 31 are interconnected by the common contact 83 (see FIG. 11).

Meanwhile, the flash memory device that is described with reference to FIGS. 1 to 11, having a unit cell composed with two semiconductor structures, can be provided as a cell array. In this flash memory device, as described above, the first gate 31 operates as a memory gate and the third gate 45a operates as a select gate. The first and third gates 31 and 45a are connected to an nth word line (WL) through the third contact 83 to form the cell array.

The second gate 32 operates as a memory gate and the fourth gate 45b operates as a select gate. At this point, the second and fourth gates 32 and 45b are connected to an (n+1)th word line through the fourth contact 84 to form the cell array.

Here, the "n" is an integer number that is equal to or greater than 1 and equal to or less than the number of the unit cells. A total of 2n word lines may be used.

The first and second drain areas 52 and 54 are both connected to an mth bit line (BL) through the first and second contacts 81 and 82, respectively.

Here, the "m" is an integer number that is equal to or greater than 1 and equal to or less than the number of the bit lines.

The common source area 59 is commonly connected to one source line (SL) through the fifth contact 85. A predetermined bias voltage can be applied to the source line.

In a typical flash memory device, no bias voltage is applied to a source area. However, in the flash memory according to embodiments of the invention, the application of the bias voltage to the common source area 59 is one of a variety of features of the present invention.

The following will describe a voltage application method when the flash memory of the embodiments operates to perform a programming process, an erasing process, and a reading process.

1. When one of the memory gates constituting the cell array of the embodiment is selected to perform the programming process,
   (1) a first predetermined positive voltage is applied to the word line of the selected memory gate and 0V is applied to the bit line of the selected memory gate,
   (2) for an unselected memory gate (or cell) sharing the word line with the selected memory gate and receiving the applied first predetermined positive voltage, a second predetermined positive voltage is applied to the bit line of the unselected memory gate sharing the word line with the selected memory gate or this bit line is left floating,
   (3) for an unselected memory gate (or cell) sharing the bit line with the selected memory gate and receiving the applied 0V, 0V is applied to the word line of the unselected memory gate sharing the bit line with the selected memory gate,
   (4) for an unselected memory gate (or cell) that does not share either of the word and bit lines with the selected memory gate, 0V is applied to the word line of the unselected memory gate that does not share either of the word and bit lines with the selected memory gate and the second predetermined positive voltage is applied to the bit line of the unselected memory gate that does not share either of the word and bit lines with the selected memory gate or this bit line is left floating, and
   (5) a third predetermined positive voltage is applied to the source line of the selected memory gate.

During the programming process, the second predetermined positive voltage can be the same voltage value as the third predetermined positive voltage. In addition, the source lines of the unselected memory gates that do not share the source line of the selected memory gate can be applied with 0V.

Figure 12:
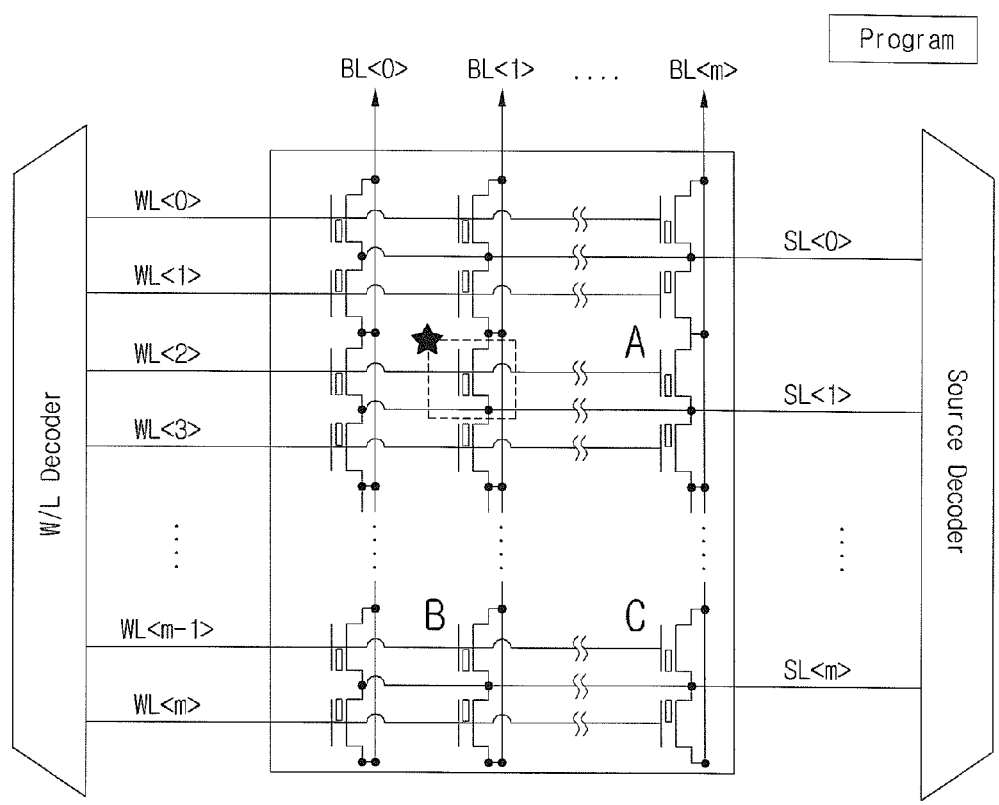
FIG. 12 shows a schematic diagram of a memory array of a flash memory device according to an embodiment of the invention, illustrating a programming process.

Referring to FIG. 12, as an example of a programming process of a selected cell (indicated with a star), the first predetermined positive voltage is applied to the word line WL<2>, 0V is applied to the bit line BL<1>, and the third predetermined positive voltage is applied to the source line SL<1>. Because cell A shares the word line with the selected cell (and also shares the source line), the bit line of cell A can be applied with the second predetermined positive voltage or be floating. Because cell B shares the bit line with the selected cell, the word line (and source line) of cell B is applied with 0V. For cell C, which does not share the word or bit lines with the selected cell, the word line of cell C is applied with 0V and the bit line is applied with the second predetermined positive voltage or is floating. The source line of cell C can be applied with 0V.

2. When one of the memory gates constituting the cell array of the embodiment is selected to perform the erasing process,
   (1) a fourth predetermined positive voltage is applied to the source line of the selected memory gate, a first predetermined negative voltage is applied to the word line of the selected memory gate, and the bit line of the selected memory gate can be floating,
   (2) for a memory gate (or cell) sharing the word line and source line with the selected memory gate, this memory gate sharing the word line and source line with the selected memory gate will also be erased,
   (3) for an unselected memory gate (or cell) sharing the bit line with the selected memory gate, 0V can be applied to the word and source lines of the unselected memory gate sharing the bit line with the selected memory gate, but there is no disturb condition and will remain programmed so long as the erase bias is not applied to the word and source lines of the unselected memory gate, and
   (4) for an unselected memory gate (or cell) that does not share either of the word and bit lines with the selected memory gate, 0V can be applied to the word and source lines of the unselected memory gate that does not share either of the word and bit lines with the selected memory gate, but there is no disturb condition and will remain programmed so long as the erase bias is not applied to the word and source lines of the unselected memory gate.

The fourth predetermined positive voltage can be the same value as the first predetermined positive voltage. In addition, the fourth predetermined positive voltage and the first predetermined negative voltage can have the same voltage magnitude, but opposite sign.

Figure 13:
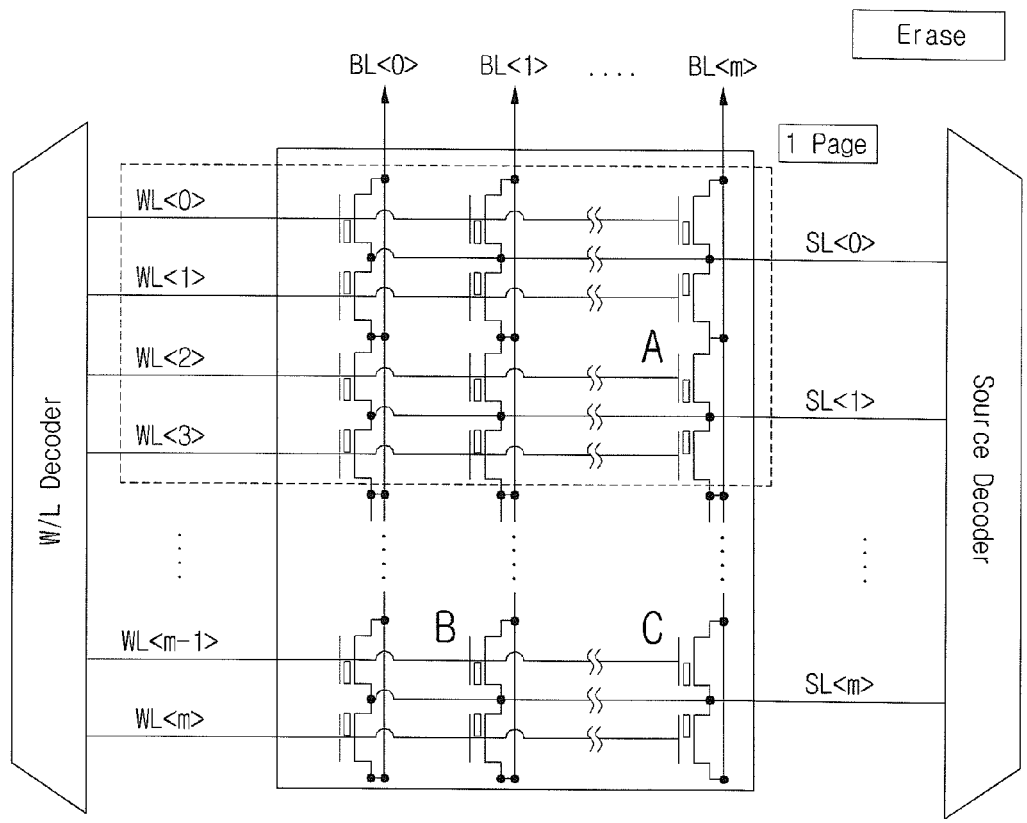
FIG. 13 shows a schematic diagram of a memory array of a flash memory device according to an embodiment of the invention, illustrating an erasing process.

The erasing operation can be performed according to page and sector. For example, to erase a page of the cell array, four word lines (WL<0>-<3>) and two source lines (SL<0>-<1>) are applied with the erase bias of the first predetermined negative voltage and the fourth predetermined positive voltage, respectively, such as shown in FIG. 13. To erase a sector, additional word lines and source lines are applied with the erase bias. For example, word lines WL<0>-<7> can be applied with the first predetermined negative voltage and source lines SL<0>-<4> can be applied with the fourth predetermined positive voltage.

3. When one of the memory gates constituting the cell array of the embodiment is selected to perform the reading process,
(1) a fifth predetermined positive voltage is applied to the word line of the selected memory gate and a sixth predetermined positive voltage is applied to the bit line of the selected memory gate, to perform the programming process. The flash memory device of the embodiment operates in a band-to-band-tunneling induced hot hole method to perform the erasing process. In addition, the flash memory device of the embodiment operates in a reverse method to perform the reading process.

In the flash memory device of an embodiment, the programming process is performed in a bit unit and the erasing process is performed in a page or sector unit. In addition, the reading process is performed in a random access method.

When one of the memory gates of the cell array of a specific embodiment is selected to perform the programming, erasing, and reading processes, the voltage is applied as shown in Table 1. The reference voltage can be 0V or GND, but the present invention is not limited to thereto.

TABLE 1

| Operational Kind of Memory Gates Operational Method | | Programming Process Hot Electron | Erasing Process BTBT Hot Hole | Reading Process Reverse |
| --- | --- | --- | --- | --- |
| Selected Cell | Word Line | +6.0 V | −6.0 V | 3.3 V |
|  | Source Line | +4.5 V | +6.0 V | reference voltage |
|  | Bit Line | reference voltage | Floating | 0.8 V |
| Unselected Cell (Sharing Word Line) | Word Line | +6.0 V | There is no disturb condition | 3.3 V |
|  | Source Line | +4.5 V |  | reference voltage |
|  | Bit Line | Floating or +4.5 V |  | reference voltage |
| Unselected Cell (Sharing Bit Line) | Word Line | reference voltage |  | reference voltage |
|  | Source Line | reference voltage |  | reference voltage |
|  | Bit Line | reference voltage |  | 0.8 V |
| Unselected Cell (Not Sharing Bit and Word Lines) | Word Line | reference voltage |  | reference voltage |
|  | Source Line | reference voltage |  | reference voltage |
|  | Bit Line | Floating or +4.5 V |  | reference voltage |

(2) for an unselected memory gate (or cell) sharing the word line with the selected memory gate and receiving the applied fifth predetermined positive voltage, 0V is applied to the bit line of the unselected memory gate sharing the word line with the selected memory gate,
(3) for an unselected memory gate (or cell) sharing the bit line with the selected memory gate and receiving the applied sixth predetermined positive voltage, 0V is applied to the word line of the unselected memory gate sharing the bit line with the selected memory gate,
(4) for an unselected memory gate (or cell) that does not share either of the word and bit lines with the selected memory gate, 0V is applied to the word and bit lines of the unselected memory gate that does not share either of the word and bit lines with the selected memory gate, and
(5) 0V is applied to the source line of the selected memory gate.

Figure 14:
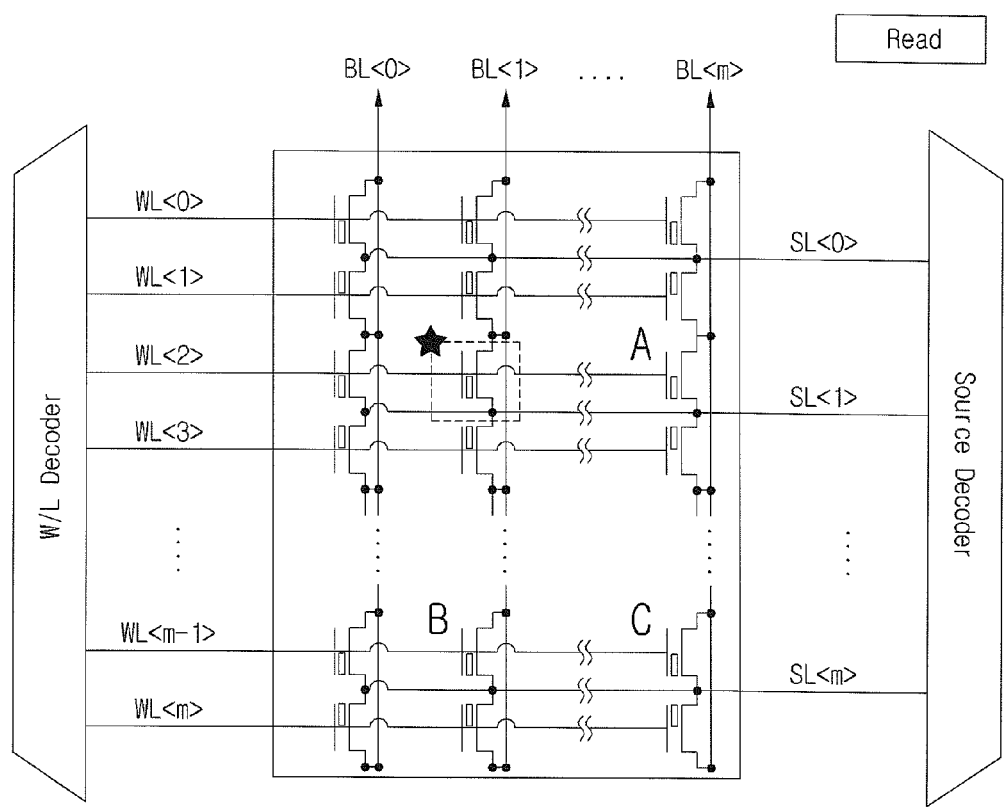
FIG. 14 shows a schematic diagram of a memory array of a flash memory device according to an embodiment of the invention, illustrating a reading process.

Referring to FIG. 14, as an example of a reading process of a selected cell (indicated with a star), the fifth predetermined positive voltage is applied to the word line WL<2>, the sixth predetermined positive voltage is applied to the bit line BL<1>, and 0V is applied to the source line SL<1>. Because cell A shares the word line with the selected cell (and also shares the source line), the bit line of cell A is applied with 0V. Because cell B shares the bit line with the selected cell, the word line (and source line) of cell B is applied with 0V. For cell C, which does not share the word or bit lines with the selected cell, the word, bit, and source lines of cell C are applied with 0V.

For reference, when the cell array of the embodiment operates to perform the programming, erasing, reading processes, bulk voltage applied to the substrate 10 may be 0V.

When the voltage is applied as described above, the flash memory device of the embodiment operates in a CHE method The flash memory device of certain embodiments has the following effects.

1. Since the flash memory device of certain embodiments is designed in a new concept having a unit cell composed with two word lines and one bit line, it has no odd-even characteristic and can provide a variety of cell arrays.

2. When the ONO layer under the memory gate is formed, the ONO layer in the peripheral area is not removed. Instead, the ONO layer in the peripheral area is removed when the etching process for forming the polysilicon pattern of the memory gate is performed. Therefore, the number of masks can be reduced, and thus the manufacturing process can be simplified.

3. The application of the operating voltage can be efficiently realized. In addition, since the influence by the stress and disturbance generated when the cell array operates can be minimized, the cell array operation can be stably realized.

4. For the programming process using the CHE method and the erasing process using the BTBT-hot hole injection method, a junction structure of the select gate, memory gate, gate dielectric, and ion implantation area and the application voltage condition can be optimized and thus the cell property can be improved.

5. Since the dielectric functioning as a trapping layer is formed in a straight line shape, the electrons trapped in the dielectric can be completely erased in the erasing process. Accordingly, the dielectric area can be effectively defined and the cell property such as an endurance property can be improved through the simplest process.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a flash memory device, the method comprising:

forming a first gate on a first dielectric on a cell area of a substrate and forming a second gate on a second dielectric on the cell area of the substrate spaced apart from the first gate and first dielectric;

forming a third dielectric on opposing sidewalls of the first gate and on a portion of the substrate around the opposing sidewalls of the first gate, and third gates on the third dielectric on the opposing sidewalls of the first gate, forming a fourth dielectric on opposing sidewalls of the second gate and on a portion of the substrate around the opposing sidewalls of the second gate, and fourth gates on the fourth dielectric on the opposing sidewalls of the second gate, and forming a fifth dielectric and a fifth gate on the fifth dielectric on a portion of a peripheral area of the substrate;

removing the third dielectric and third gate from the opposing sidewall of the first gate that faces the second gate and removing the fourth dielectric and fourth gate from the opposing sidewall of the second gate that faces the first gate, such that the third dielectric and the third gate on the opposing sidewall of the first gate that faces away from the second gate remains and the fourth dielectric and fourth gate on the opposing sidewall of the second gate that faces away from the first gate remains;

forming a first spacer on a side of the remaining third gate, a second spacer on the opposing sidewall of the first gate that faces the second gate, a third spacer on the opposing sidewall of the second gate that faces the first gate, a fourth spacer on a side of the remaining fourth gate, and fifth spacers on opposing sidewalls of the fifth gate; and forming first and second drain areas on a portion of the cell area near the first and fourth spacers, respectively, forming a common source area on a portion of the cell area between the second and third spacers, and forming a source area and a third drain area at sides of the fifth spacers on a portion of the peripheral area at opposing sides of the fifth gate.

2. The method according to claim 1, wherein the forming of the first gate on the first dielectric on the cell area of the substrate and the forming of the second gate on the second dielectric on the cell area of the substrate spaced apart from the first gate and first dielectric comprises:

sequentially forming a first oxide layer, a first nitride layer, a second oxide layer, and a first polysilicon layer on the cell area and the peripheral area of the substrate;

forming a first photoresist pattern defining areas of the first and second gates on the cell area;

performing a first etching process of the first polysilicon layer, the second oxide layer, the first nitride layer, and the first oxide layer using the first photoresist pattern as an etch mask, thereby forming the first and second gates on the first and second dielectrics, the first and second dielectrics being formed with patterns of the first oxide layer, first nitride layer, and second oxide layer, and the first and second gates being formed with a pattern of the first polysilicon layer; and removing the first photoresist pattern.

3. The method according to claim 1, wherein the forming of the third dielectric on the opposing sidewalls of the first gate and on the portion of the substrate around the opposing sidewalls of the first gate, and the third gates on the third dielectric on the opposing sidewalls of the first gate, the forming of the fourth dielectric on the opposing sidewalls of the second gate and on the portion of the substrate around the opposing sidewalls of the second gate, and the fourth gates on the fourth dielectric on the opposing sidewalls of the second gate, and the forming of the fifth dielectric and the fifth gate on the fifth dielectric on the portion of the peripheral area of the substrate comprises:

forming a third oxide layer on the cell area having the first and second gates;

forming a second photoresist pattern on the cell area and removing the third oxide layer on the peripheral area through a second etching process using the second photoresist pattern as an etch mask;

forming a fourth oxide layer on the peripheral area;

removing the second photoresist pattern;

forming a second polysilicon layer on the third and fourth oxide layers; and performing a third etching process of the second polysilicon layer, the third oxide layer and the fourth oxide layer, thereby forming the third and fourth gates on the third and fourth dielectrics and the fifth gate on the fifth dielectric, wherein the third and fourth dielectrics are each formed with a pattern of the third oxide layer, the third and fourth gates are each formed with a pattern of the second polysilicon layer, the fifth dielectric is formed with a pattern of the fourth oxide layer, and the fifth gate is formed with another pattern of the second polysilicon layer.

4. The method according to claim 3, further comprising:

forming a third photoresist pattern defining an area of the fifth gate on the peripheral area after forming the second polysilicon layer; and removing the third photoresist pattern after performing the third etching process, wherein the third etching process is performed in a blanket method for the cell area and wherein the third etching process is performed using the third photoresist pattern as a mask for the peripheral area.

5. The method according to claim 1, wherein the forming of the first spacer on the side of the remaining third gate, the second spacer on the opposing sidewall of the first gate that faces the second gate, the third spacer on the opposing sidewall of the second gate that faces the first gate, the fourth spacer on the side of the remaining fourth gate, and the fifth spacers on the opposing sidewalls of the fifth gate comprises:

sequentially stacking at least one of an oxide layer, a nitride layer, and another oxide layer on the cell and peripheral areas and performing a fifth etching process of a blanket method.

6. The method according to claim 1, further comprising forming a source-side lightly doped drain region between the first and second gates after the removing of the third dielectric and the third gate from the opposing sidewall of the first gate that faces the second gate and the removing the fourth dielectric and the fourth gate from the opposing sidewall of the second gate that faces the first gate; and
    forming drain-side lightly doped drain regions near sides of the third and fourth gates.

7. The method according to claim 1, further comprising:
    forming a first common contact connecting a portion of the third gate exposed by the first spacer to the first gate and forming a second common contact connecting a portion of the fourth gate exposed by the fourth spacer to the second gate.

8. A method of manufacturing a flash memory device, the method comprising:
    forming a first gate on a first dielectric on a cell area of a substrate;
    forming a third dielectric on a side of the first gate and on a portion of the substrate near the side of the first gate, and forming a third gate on the third dielectric after forming the first gate, the third gate not overlapping the first gate in a vertical direction:
    forming a common source area on the cell area near an opposite side of the first gate; and
    forming a drain area on a portion of the cell area near the third gate;
    wherein the forming of the third dielectric on the side of the first gate and on the portion of the substrate near the side of the first gate. and the forming of the third gate on the third dielectric comprises:
    forming the third dielectric on opposing sidewalls of the first gate and on portions of the substrate around the opposing sidewalk of the first gate;
    forming gates on the third dielectric on the opposing sidewalls of the first gate; and
    removing one of the gates and the third dielectric from one side of the first gate.

9. The method according to claim 8, wherein the forming of the first gate on the First dielectric on the cell area of the substrate comprises:
    sequentially forming a first oxide layer, a first nitride layer, a second oxide layer, and a first polysilicon layer on the cell area;
    forming a photoresist pattern defining an area of the first gate on the cell area;
    performing a first etching process of the first polysilicon layer, the second oxide layer, the first nitride layer, and the first oxide layer, thereby forming the first gate with a pattern of the first polysilicon layer and forming the first dielectric with patterns of the first oxide layer, first nitride layer, and second oxide layer; and
    removing the first photoresist pattern, and
    wherein the forming of the third dielectric on the side of the first gate and on the portion of the substrate near the side of the first gate, and the forming of the third gate on the third dielectric comprises:
    forming a third oxide layer on the cell area having the first gate;
    forming a second polysilicon layer on the third oxide layer; and
    performing a third etching process of a blanket method, thereby forming the third gate with a pattern of the second polysilicon layer and forming the third dielectric a pattern of the third oxide layer.

10. The method according to claim 8, further comprising forming a first spacer at a side of the third gate and a second spacer on the opposite side of the first gate,
    wherein the forming of the first and second spacers comprises:
    stacking at least one of an oxide layer, a nitride layer, and another oxide layer on the cell area; and
    performing a blanket etching process.

11. The method according to claim 8, further comprising forming a common contact connecting the third gate to the first gate.

12. A flash memory device comprising:
    a first gate on a first dielectric on a cell area of a substrate;
    a common source area on the substrate near a side surface of the first gate;
    a third dielectric on an opposite side surface of the first gate and a portion of the substrate near the opposite side surface of the first gate;
    a third gate on the third dielectric; the third gate not overlapping the first gate in a vertical direction;
    a first drain area on the substrate near a side of the third gate;
    a first spacer on the side surface of the first gate;
    a second spacer on a side surface of the third gate; and
    a first well on the cell area.

13. The flash memory device according to claim 12, further comprising:
    a second gate on a second dielectric on the cell area of the substrate spaced apart from the first gate and first dielectric with the common source area disposed between the first gate and the second gate;
    a fifth gate on a fifth dielectric on a peripheral area of the substrate;
    a fourth dielectric on a sidewall of the second gate that faces away from the first gate and on a portion of the substrate near the sidewall of the second gate that faces away from the first gate;
    a fourth gate on the fourth dielectric;
    a first spacer on a side portion of the third gate, a second spacer on a sidewall of the first gate that faces the second gate, a third spacer on a sidewall of the second gate that faces the first gate, and a fourth spacer on a side portion of the fourth gate;
    fifth spacers on opposing sidewalls of the fifth gate;
    a second drain area on the substrate near a side of the fourth spacer; and
    a source area and a third drain area on the substrate near the fifth spacers on opposing sides of the fifth gate.

14. The flash memory device according to claim 13, further comprising a first common contact connecting the third gate to the first gate and a second common contact connecting the fourth gate to the second gate.

15. The flash memory device according to claim 12, wherein the first gate on the first dielectric, the common source area on the substrate near the side surface of the first gate, the third gate on the third dielectric, and the first drain area on the substrate near the side of the third gate provides a unit cell of a cell array, the first gate operating as a memory gate and the third gate operating as a select gate, wherein the first gate and the third gate are both connected to an nth word line;
    wherein the first drain area is connected to an mth bit line;
    wherein the common source area is commonly connected to one source line;
    wherein the source line is configured to receive a predetermined bias voltage
    where the "n" is an integer number that is equal to or less than 1 and equal to or less than the number of unit cells of the cell array, and the "m" is an integer number that is equal to or less than 1 and equal to or less than a total number of bit lines.

16. A method of using the flash memory device of claim 15, the method comprising selecting the memory gate to perform a programming operation by:
- applying a first predetermined positive voltage to a selected word line of the selected memory gate;
- applying a first reference voltage to a selected bit line of the selected memory gate;
- applying a floating state or a second predetermined positive voltage to a first unselected bit line of a first unselected memory gate, the first unselected memory gate sharing the selected word line with the selected memory gate;
- applying a second reference voltage to a second unselected word line of a second unselected memory gate, the second unselected memory gate sharing the selected bit line with the selected memory gate;
- applying a third reference voltage to a third unselected word line of a third unselected memory gate, the third unselected memory gate not sharing the selected bit line and not sharing the selected word line with the selected memory gate; and
- applying a third predetermined positive voltage to the source line of the selected memory gate.

17. A method of using the flash memory device of claim 15, the method comprising selecting the memory gate to perform an erasing operation by:
- applying a first predetermined negative voltage to a selected word line of the selected memory gate; and
- applying a fourth predetermined positive voltage to the source line of the selected memory gate.

18. A method of using the flash memory device of claim 15, the method comprising selecting the memory gate to perform a reading operation by:
- applying a fifth predetermined positive voltage to a selected word line of the selected memory gate;
- applying a sixth predetermined positive voltage to a selected bit line of the selected memory gate;
- applying a fourth reference voltage to the source line of the selected memory gate;
- applying a fifth reference voltage to a first unselected bit line of a first unselected memory gate, the first unselected memory gate sharing the selected word line with the selected memory gate;
- applying a sixth reference voltage to a second unselected word line of a second unselected memory gate, the second unselected memory gate sharing the selected bit line with the selected memory gate; and
- applying a seventh reference voltage to a third unselected word line of a third unselected memory gate, and applying an eighth reference voltage to a third unselected bit line of the third unselected memory gate, the third unselected memory gate not sharing the selected word line and not sharing the selected bit line with the selected memory gate.

* * * * *